United States Patent [19]
Inoue

[11] Patent Number: 5,744,835
[45] Date of Patent: Apr. 28, 1998

[54] MOS SEMICONDUCTOR DEVICE WITH MASK LAYERS

[75] Inventor: Hiroyuki Inoue, Tokyo, Japan

[73] Assignee: Nippon Steel Corporation, Tokyo, Japan

[21] Appl. No.: 747,928

[22] Filed: Nov. 12, 1996

[30] Foreign Application Priority Data

Nov. 14, 1995 [JP] Japan ................ 7-319482

[51] Int. Cl.⁶ .................................. H01L 27/088
[52] U.S. Cl. .................. 257/336; 257/344; 257/377; 257/383; 257/408; 257/900
[58] Field of Search .................. 257/408, 344, 257/336, 382, 383, 377, 411, 900

[56] References Cited

U.S. PATENT DOCUMENTS

| | | | |
|---|---|---|---|
| 5,113,234 | 5/1992 | Furuta et al. | 257/408 X |
| 5,504,359 | 4/1996 | Rodder | 257/408 X |

FOREIGN PATENT DOCUMENTS

| | | | |
|---|---|---|---|
| 0538054 A1 | 4/1993 | European Pat. Off. | 257/408 |
| A-62-86715 | 4/1987 | Japan. | |
| 406029310 A | 2/1994 | Japan | 257/408 |
| A-7-14931 | 1/1995 | Japan. | |

*Primary Examiner*—William Mintel
*Attorney, Agent, or Firm*—Pollock, Vande Sande & Priddy

[57] ABSTRACT

In a semiconductor device in which a source/drain and a wiring layer are connected to each other through an associated buried conductive layer on an upper portion of a gate electrode is made small to manufacture a highly reliable and fine MOS transistor. After a silicon oxide film has been formed on a first polycrystalline film to be aligned with a width of a gate electrode, a second polycrystalline silicon film formed on the whole surface of a substrate is selectively etched away so as to be left only on both side faces of a pattern of the silicon oxide film. Thereafter, the first polycrystalline silicon film is selectively etched away with both the silicon oxide film and the second polycrystalline silicon film as an etching mask so that the first polycrystalline film is separated with a width which is smaller than that of the gate electrode by a width of a pattern of the second polycrystalline silicon film. As a result, the buried conductive layer including the first and second polycrystalline silicon film is formed.

11 Claims, 8 Drawing Sheets

MOS SEMICONDUCTOR DEVICE WITH MASK LAYERS

BACKGROUND OF THE INVENTION

1. Field of the Invention

The present invention relates to a semiconductor device and to a method for manufacturing the same. More particularly, it relates to a semiconductor device having a buried conductive layer which is connected to a source/drain of a MOS transistor and extends over a gate electrode of the MOS transistor, and to a method for manufacturing the same.

2. Description of the Related Art

In recent years, as high integration and scale-down (i.e., shrinking) of a semiconductor device have progressed, the alignment margin in the photolithographic process for a contact hole, formed to connect a source/drain of a MOS transistor and a wiring layer to each other, is decreasing. In addition, the aspect ratio of the contact hole is also increasing. Now, the aspect ratio is defined by the ratio of depth to diameter of the contact hole. From the foregoing, a technique has been adopted in which the source/drain of the MOS transistor and the wiring layer are not directly connected to each other, but instead are indirectly connected to each other through a buried conductive layer (an extraction electrode) formed on the source/drain.

Now, the process of manufacturing a MOS transistor employing that buried conductive layer will hereinbelow be described with reference to FIGS. 1A to 1E.

Firstly, as shown in FIG. 1A, after a field oxide film 102 has been formed in a region to be an isolation region of a silicon substrate 101 by utilizing the well known LOCOS (Local Oxidation of Silicon) method, a gate oxide film 103 is formed in an active region surrounded by the field oxide film 102 by the thermal oxidation method. Thereafter, a polycrystalline silicon containing phosphorus or arsenic, and a silicon oxide film 104, are formed in this order by the CVD method, and those films are then subjected to anisotropic etching with a photoresist film (not shown), formed to have a gate electrode patterned by photolithographic technology, as an etching mask, thereby forming a gate electrode 105 formed of the polycrystalline silicon film. In addition, the impurity ions are implanted into the unmasked region with the gate electrode 105 as a mask, thereby forming a pair of lightly doped impurity diffusion layers 106 in surface portions of the silicon substrate 101 on both sides of the gate electrode.

Next, as shown in FIG. 1B, after a silicon oxide film has been formed on the whole surface of the silicon substrate 101, the silicon oxide film is selectively etched away by anisotropic etching, thereby forming a side wall oxide film 107 on each of both side faces of the gate electrode 105 and the silicon oxide film 104 by anisotropic etching. Incidentally, a portion of the gate oxide film 103 formed on the region which is not covered with the gate electrode 105 or the side wall oxide film 107 is removed concurrently with the selective etching of the silicon oxide film.

Next, as shown in FIG. 1C, a polycrystalline silicon film 108 containing phosphorus or arsenic is formed on the whole surface of the silicon substrate 101 by the CVD method. This polycrystalline silicon film 108 will later become a buried conductive layer. Thereafter, the impurity ions are implanted into the unmasked region with both the gate electrode 105 and the side wall oxide film 107 as a mask, thereby forming a pair of highly doped impurity diffusion layers 109 as a source and a drain in the surface regions of the silicon substrate 101 on both sides of the gate electrode 105.

Next, as shown in FIG. 1D, after a photoresist film 110 has been applied to the polycrystalline silicon film 108, the photoresist film 110 is processed to have a pattern, of the buried conductive layer, having a slit 110a on the gate electrode 105 by the photolithographic method. Thereafter, the polycrystalline silicon film 108 is selectively etched away by anisotropic dry etching with the photoresist film 110 as an etching mask, thereby processing the polycrystalline silicon film 108 to have a pattern which is separated into portions, located on both sides of the gate electrode 105, with a width of the slit 110a.

Next, as shown in FIG. 1E, the photoresist film 110 is removed. By carrying out the above-mentioned process, it is possible to form buried conductive layers 111 formed of the polycrystalline silicon film 108, which are respectively self-aligned with the pair of impurity diffusion layers 109 of the MOS transistor and each of which extends up to an upper portion of the gate electrode 105.

The buried conductive layers 111 are formed in such a way that the alignment margin of the contact hole for the wiring connection which is formed through the insulating film on the associated buried conductive layer 111 can be increased. Also, the substantial aspect ratio of that contact hole can be decreased by the thickness of the associated buried conductive layer 111. As a result, it is possible to improve the reliability of the wiring connection in the contact hole portion. In addition, since the impurity diffusion layers 109, each having a shallower junction, can also be formed, while suppressing occurrence of any crystal defect in the silicon substrate 101, by thermal diffusion from the buried conductive layers 111. Formation of the buried conductive layer 111 is also suitable for scaling down of the semiconductor device.

Now, when forming the above-mentioned buried conductive layer 111, in the process shown in FIG. 1D, the slit 110a of the photoresist film 110 needs to be formed to reach the portion above the upper side of the gate electrode 105, and also to have a width thereof much smaller than a width of the gate electrode 105 (a gate length).

If, due to the mismatch of alignment in the photolithography process, the central position of the slit of the photoresist film 110 is shifted in the direction of a width of the gate electrode by a distance X as shown in FIG. 2, for example, so that the edge of the hole of the photoresist film 110 is located on the associated side wall oxide film 107, under this condition, the polycrystalline silicon film 108 is subjected to the anisotropic etching. Then not only the buried conductive layer 111 in the boundary portion between the buried conductive layer 111 of interest and the associated side wall oxide film 107 will be selectively etched away during over-etching, but also the thin portion of the side wall oxide film 107 as well as the gate oxide film 103 will be etched away, and finally the surface of the silicon substrate 101 will be exposed.

Then, if the surface of the silicon substrate 101 is exposed, since the etch selectivity of the silicon substrate 101 to the buried conductive layer 111 formed of a polycrystalline silicon film is remarkably small, even the surface of the silicon substrate 101 will be partially etched away. As a result, a trench 120 will be formed in the silicon substrate 101 by the etching. In such a way, the silicon substrate 101 will be damaged. Such damage of the silicon substrate 101 results in the performance of the MOS transistor being remarkably degraded.

To avoid that situation, the width of the slit 110a of the photoresist film 110 needs to be made much smaller than the gate length of the gate electrode 105 so that the hole edge of the photoresist film 110 is not located on the associated sidewall oxide film 107 even if the slight mismatch of alignment occurs. This means that the gate length of the gate electrode 105 needs to be made much larger than the width of the slit 110a of the photoresist film 110. Thus, even if the width of the slit 110a of the photoresist film 110 should be made a minimum processing size provided by the photolithographic technology, the gate length of the gate electrode 105 needs to be made much larger than the minimum processing size. As a result, in the above-mentioned method of forming the buried conductive layer 111, there is a limit in scale-down (i.e., shrinking) of the transistor.

To prevent damage of the silicon substrate 101 due to the exposure of the surface of the silicon substrate 101, there are considered (a) a method including the step of forming a polycrystalline silicon film, which will form a buried conductive layer later, after further forming an insulating film on the side wall oxide films, or (b) a method including the step of forming a thicker side wall oxide film 107. However, in the former method, by the fine pattern technology, a hole needs to be formed through the insulating film formed on the associated side wall oxide film 107 so that contact is made between the buried conductive layer and the source/drain. As a result, the advantage, resulting from the buried conductive layer, of being able to form the buried conductive layer to be self-aligned with the source/drain, is lost. In addition, in the latter method, the width of each side wall oxide film 107 becomes necessarily large. Hence, this results in the fine transistor not being able to be formed. Therefore, the above-mentioned two methods for preventing the damage of the silicon substrate 101 are not suitable for practical use.

In addition, in JP-A-62-86715, there is described a method for manufacturing a semiconductor device wherein a contact hole is formed to be tapered in order to reduce the possibility of disconnection of the wiring layer.

The manufacturing method described in JP-A-62-86715 will hereinbelow be described.

After a contact region, having a predetermined pattern, has been formed on a semiconductor substrate, an insulating layer is formed to cover the contact region. Next, a first photoresist mask is formed which is used to form a first contact hole. Thereafter, the insulating layer is etched to the depth of about one-half of the thickness of the insulating layer by anisotropic etching, thereby forming the first contact hole. Thereafter, the first photoresist mask is removed, and then a polycrystalline silicon layer is formed on the whole surface of the semiconductor substrate. Next, the whole surface of the polycrystalline silicon layer is selectively etched away by gas plasma to leave a part of the polycrystalline silicon layer on both an edge portion of the first contact hole and a stepped portion of the insulating film. Subsequently, a second photoresist mask is formed which is used to form a second contact hole. Then a second contact hole is formed through the insulating film remaining in the first contact hole by etching.

While the above-mentioned manufacturing method is suitable for the scale-down of the semiconductor device, the etching, by which the first contact hole is perforated, needs to be stopped at the time when the thickness of the insulating layer has been halved; hence, the control of the amount of etching is difficult to be carried out.

SUMMARY OF THE INVENTION

In view of the foregoing problems associated with the prior art, an object of the present invention is, in a semiconductor device having a buried conductive layer connected to a source/drain of a MOS transistor and extending over a gate electrode of the MOS transistor, to enable manufacture of a finer transistor as compared with the prior art transistor while preventing damage to a semiconductor substrate without excessively complicating the manufacturing process.

To attain the above-mentioned object, according to the present invention, a method for manufacturing a semiconductor device includes the steps of: (a) forming a first insulating film on a semiconductor substrate; (b) forming a first conductive film as a gate electrode and a second insulating film on the first insulating film; (c) forming a third insulating film on the whole surface of the semiconductor substrate having the first insulating film, the first conductive film and the second insulating film formed thereon; (d) selectively etching away the third insulating film to form a side wall insulating film including the third insulating film on each of both side faces of the first conductive film and the second insulating film and also to expose the semiconductor substrate in portions which are not covered with both the side wall insulating film and the first conductive film; (e) diffusing impurities into the exposed portions of the semiconductor substrate to form a source and a drain in the semiconductor substrate; (f) forming a second conductive film to be a part of a buried conductive layer on the whole surface of the semiconductor substrate having the first insulating film, the first conductive film, the second insulating film and the side wall insulating film formed thereon; (g) forming a first mask layer on the second conductive film; (h) processing the first layer so as for the first mask layer to have a pattern which is separated into both side portions with the first conductive film; (i) forming a second mask layer on the whole surface of the semiconductor substrate having the first insulating film, the first conductive film, the second insulating film, the side wall insulating film, the second conductive film and the first mask layer formed thereon; (j) selectively etching away the second mask layer to leave a pattern of the second mask layer on each of both side faces of the pattern of the first mask layer; and (k) selectively etching away the second conductive film with the patterns of the first and second mask layers as a mask so as to process the second conductive film into a pattern in which the second conductive film is separated on the second insulating film.

In addition, according to the present invention, there is provided a semiconductor device including: (a) a semiconductor substrate having a source and a drain of a MOS transistor formed therein; (b) a first insulating film formed on a predetermined region of the semiconductor substrate; (c) a first conductive film as a gate electrode and a second insulating film formed on a predetermined region of the first insulating film; (d) a third insulating film, as a side wall insulating film, formed on each of both side faces of the first conductive film and the second insulating film; (e) a second conductive film connected to one of the source and the drain of the MOS transistor and extending up to an upper portion of the gate electrode of the MOS transistor, the second conductive fill having a pattern in which the second conductive film is separated into both side portions with the second insulating film; (f) a first mask layer formed on a first region of the second conductive film; and (g) a second mask layer formed on a second region of the second conductive film along each of side faces of the first mask layer.

After the second conductive film has been selectively etched away to be processed into a predetermined pattern, the first mask layer may be removed so that the resultant second conductive film is used as a lower electrode of a capacitor.

According to the present invention, since the first mask layer is formed on a region of a part of the second conductive film, and the second conductive film is selectively etched away with both the pattern of the first mask layer and the pattern of the second mask layer formed on each of both side faces thereof as an etching mask, the interval of the patterns of the second conductive films which are adjacent to each other on the second insulating film can be made smaller than that of the patterns of the first mask layers by a width of the pattern of the second mask layer as compared with the interval. As a result, even if the position of the edge portion of the pattern of the first mask layer is slightly shifted, it is possible, to reduce the probability that the edge portion of the pattern of the second conductive film is located on the associated side wall insulating film. Hence, it is possible to promote scale down (i.e., shrinking) of the semiconductor device.

In addition, when the interval of the patterns of the first mask layers is made a minimum processing size in the photolithographic technology, the interval of the patterns of the second mask layers can be made smaller than the minimum processing size. Therefore, the width of the first conductive film, i.e., the gate electrode, can be made smaller than that of the prior art; e.g., it can be reduced to the minimum processing size.

Incidentally, in the present invention, each of the first and second mask layers may be formed of either a conductive film or an insulating film. In the case where one or both of the first and second mask layers is a conductive film, the mask layer of interest forms, together with the second conductive film, the buried conductive layer.

BRIEF DESCRIPTION OF THE DRAWINGS

The above and other objects as well as advantages of the present invention will become clear by the following description of the preferred embodiments of the present invention with reference to the accompanying drawings, wherein.

DESCRIPTION OF THE PREFERRED EMBODIMENTS

The preferred embodiments of the present invention will hereinafter be described in detail with reference to the accompanying drawings.

Referring first to FIGS. 3A to 3I, there are illustrated cross sectional views showing a semiconductor device according to a first embodiment of the present invention and a method for manufacturing the same in order of process.

Figure 1A:
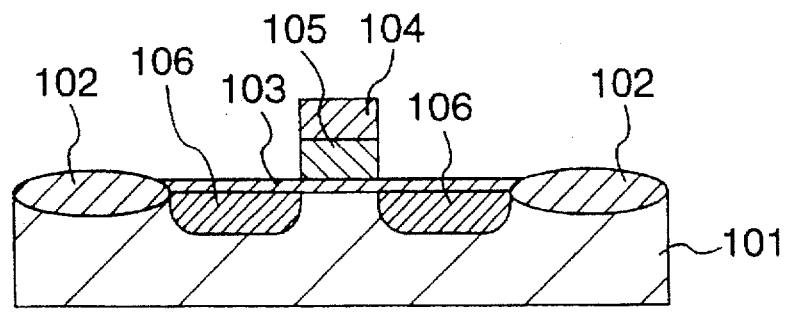
FIGS. 1A to 1E are, respectively, cross sectional views showing a conventional semiconductor device and a method for manufacturing the same in order of process.
Figure 1B:
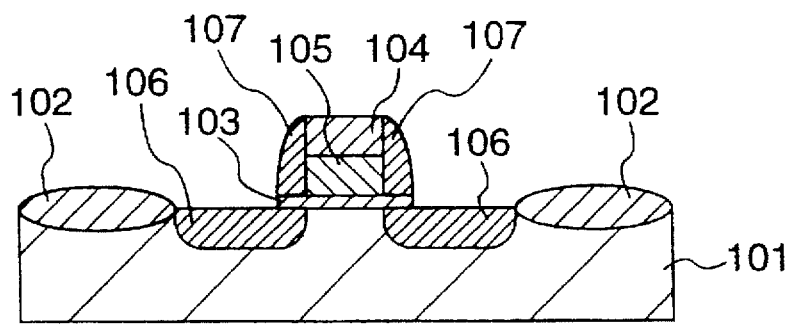
Figure 1C:
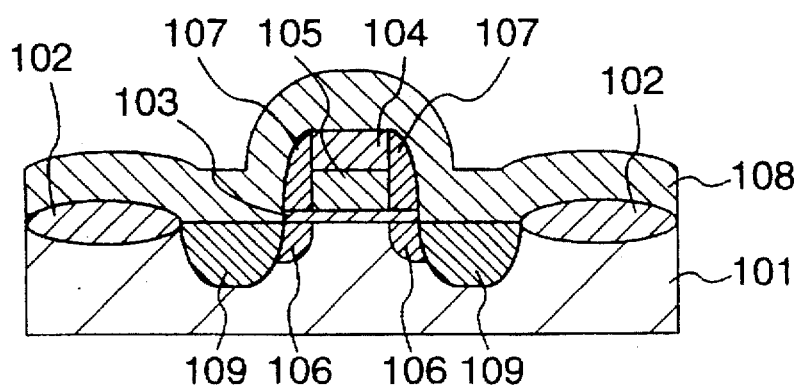
Figure 1D:
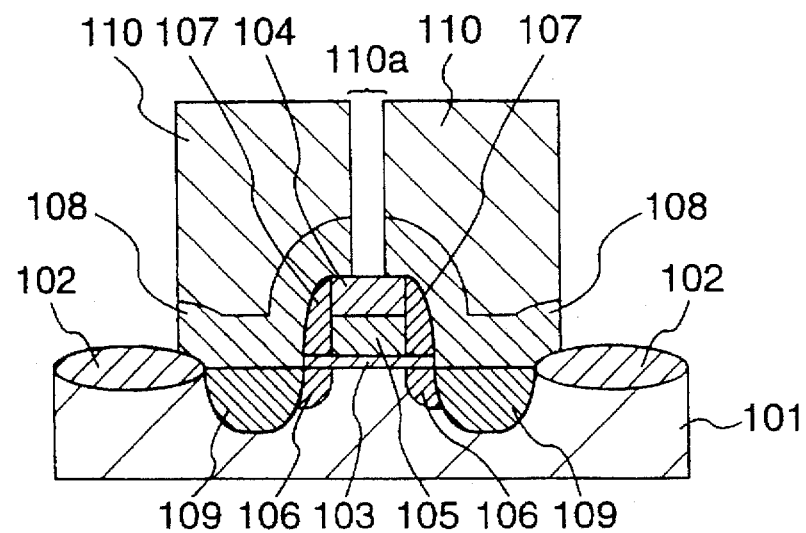
Figure 1E:
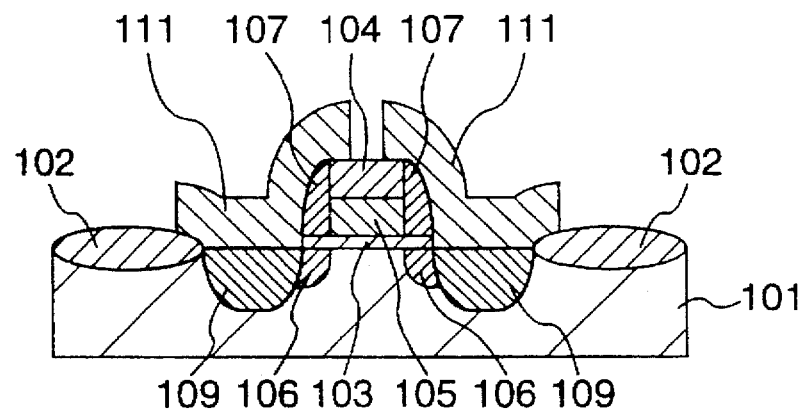
Figure 2:
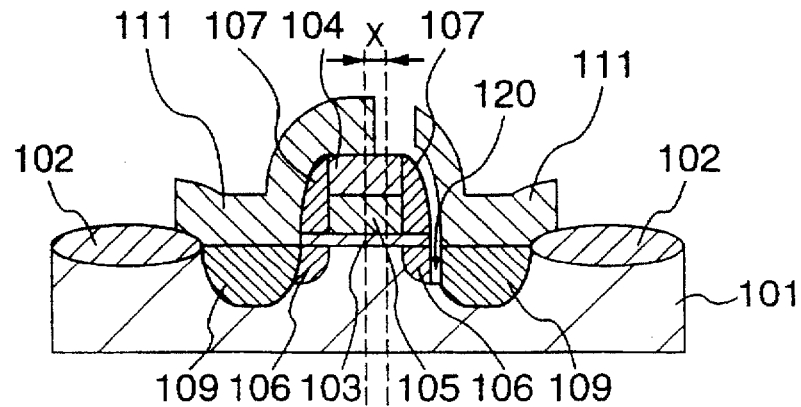
FIG. 2 is a cross sectional view useful in explaining the problems associated with the conventional semiconductor device and a method for manufacturing the same.
Figure 3A:
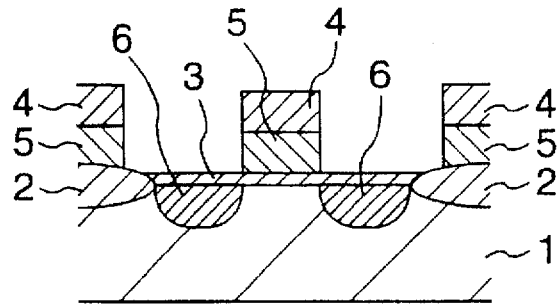
FIGS. 3A to 3I are, respectively, cross sectional views showing a semiconductor device according to a first embodiment of the present invention and a method for manufacturing the same in order of process.

Firstly, as shown in FIG. 3A, a field oxide film 2 with about 400 nm thickness is formed in a region to be an isolation region of a P type semiconductor silicon substrate 1 containing boron and having resistivity in the range of 1 to 12 $\Omega$ cm by the well-known LOCOS method. Thereafter, a gate oxide film 3 with a thickness of 10 to 20 nm, or so, is formed on an active region, which is surrounded by the field oxide film 2, by the thermal oxidation method.

Then, after a polycrystalline silicon film about 100 nm thick containing phosphorus or arsenic of $2 \times 10^{20}$ to $6 \times 10^{20}$ atoms/cm$^3$ is formed by the CVD method, a silicon oxide film 4 about 200 nm thick is formed on that polycrystalline silicon film by the CVD method. Thereafter, a photoresist film (not shown) is applied to the silicon oxide film 4 and then is processed to have a gate electrode pattern by utilizing the photolithographic technology. Then, the silicon oxide film 4 is selectively etched away with that photoresist film as an etching mask by anisotropic etching, whereby the silicon oxide film 4 is processed to have a gate electrode shape. Subsequently, after the photoresist film has been removed by ashing, that polycrystalline silicon film is selectively etched away with the silicon oxide film 4 as an etching mask by anisotropic etching, thereby forming a gate electrode 5 formed of that polycrystalline silicon film. In addition, phosphorus ions are implanted into the masked region of the P type semiconductor silicon substrate 1 with the gate electrode 5 as a mask at acceleration energy of 30 to 150 keV with a dose of $5 \times 10^{12}$ to $5 \times 10^{13}$ ions/cm$^2$, whereby a pair of lightly doped impurity diffusion layers 6 are formed in the surface portions of the silicon substrate 1 on both sides of the gate electrode 5.

Figure 3B:
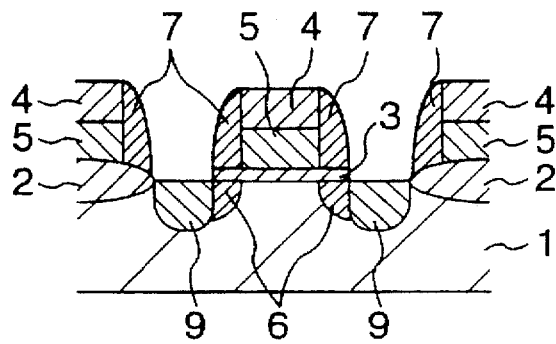

Next, as shown in FIG. 3B, after a silicon oxide film whose thickness is in the range of about 100 to 200 nm has been formed on the whole surface of the silicon substrate 1, the silicon oxide film is subjected to anisotropic etching, whereby a side wall oxide film 7 is formed on each of both side faces of the gate electrode 5 and the silicon oxide film 4. A part of the gate oxide film 3 in the region, not covered with the gate electrode 5 or the side wall oxide film 7, is removed at the same time that the silicon oxide film is selectively etched away by the anisotropic etching, and as a result, a part of the silicon substrate 1 is exposed. Thereafter, arsenic ions are implanted into the unmasked region of the silicon substrate 1 with both the gate electrode 5 and the side wall oxide film 7 as a mask at acceleration energy of 50 to 100 keV with a dose of $5 \times 10^{15}$ to $5 \times 10^{16}$ ions/cm$^2$, whereby a pair of highly doped impurity diffusion layers 9 as a source and a drain are formed in the surface portions of the silicon substrate 1 on both sides of gate electrode 5.

Figure 3C:
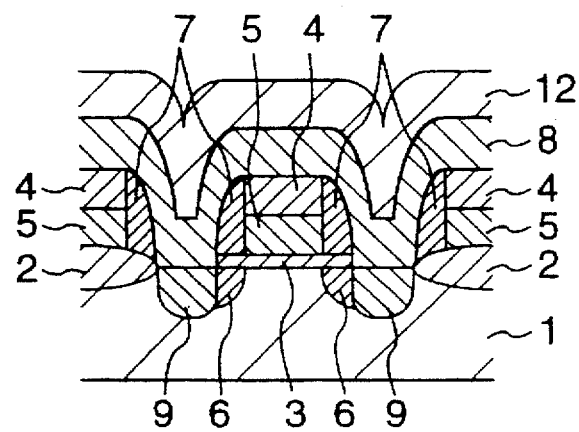

Next, as shown in FIG. 3C, a polycrystalline silicon film 8 containing phosphorus or arsenic and having a thickness in the range of about 300 to 500 nm is formed on the whole surface of the silicon substrate 1 by the CVD method. This polycrystalline silicon film 8 thus formed will become a part of a buried conductive layer (an extraction electrode) later. Thereafter, a silicon oxide film (a first mask layer) 12 with about 200 nm thickness is formed on the whole surface of the polycrystalline silicon film 8 by the CVD method.

Figure 3D:
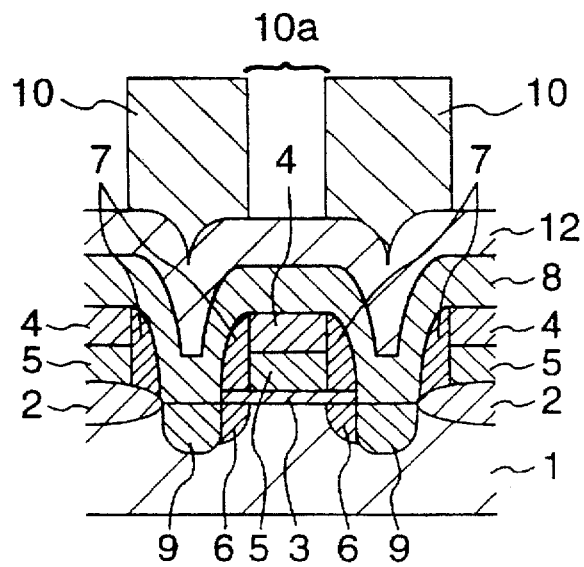

Next, as shown in FIG. 3D, after a photoresist film 10 has been applied to the whole surface of the silicon oxide film 12, the photoresist film 10 is processed by the photolithograpic method to have a pattern having a slit 10a above the gate electrode 5, the pattern corresponding in a shape to the buried conductive layer In this connection, the width of the slit 10a of the photoresist film 10 is made substantially the same as the width of the gate electrode (a gate length) 5. If the width of the slit 10a is made to have a minimum processing size in the photolithographic technology, then the gate length may also be made substantially the same as the minimum processing size.

Figure 3E:
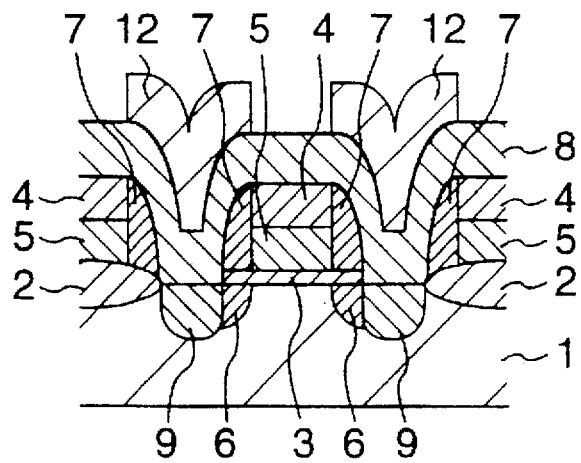

Next, as shown in FIG. 3E, the silicon oxide film 12 is selectively etched away with the photoresist film 10 as an etching mask by anisotropic dry etching to be separated into portions, located on both sides of the gate electrode 5, with a distance corresponding to the width of the slit 10a. Thereafter, the photoresist film 10 is removed by ashing.

Figure 3F:
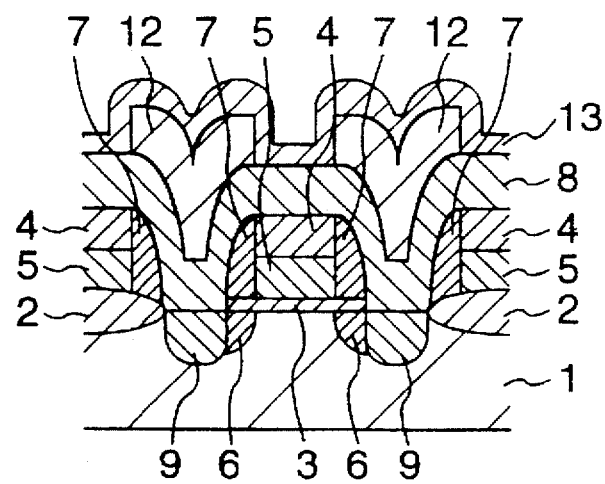

Next, as shown in FIG. 3F, a polycrystalline silicon film (a second mask layer) 13 about 200 nm thick, which will be a part of the buried conductive layer later, is formed on the whole surface of the silicon substrate 1 by the CVD method. The thickness of the polycrystalline silicon film 13 is preferably one third of the distance between two portions of the silicon oxide film 12 as shown in FIG. 3E so that the area between the two portions is not completely filled with the polycrystalline silicon film 13.

Figure 3G:
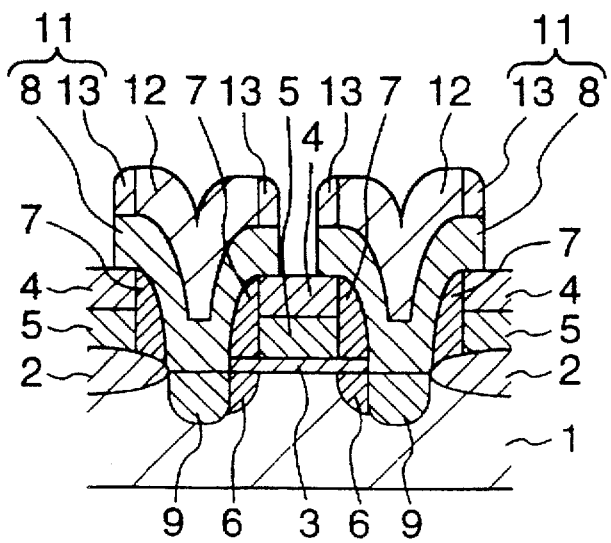

Next, as shown in FIG. 3G, the polycrystalline silicon film 13 is subjected to anisotropic dry etching to be left only on both side faces of the silicon oxide film 12.

Subsequently, the polycrystalline silicon film 8 is selectively etched away with both the silicon oxide film 12 and the polycrystalline silicon film 13 as an etching mask, whereby the polycrystalline silicon film 8 is removed except for its part underlying both the silicon oxide film 12 and the polycrystalline silicon film 13 so that the polycrystalline silicon film 8 is processed to have a pattern which is separated on the silicon oxide film 4. At this time, a separation width of the polycrystalline silicon film 8 is smaller than the width of the slit 10a by the width of the polycrystalline silicon film 13 remaining on both side faces of the silicon oxide film 12. As a result, the buried conductive layer 11 including the remaining polycrystalline silicon films 8 and 13 is formed.

Figure 3H:
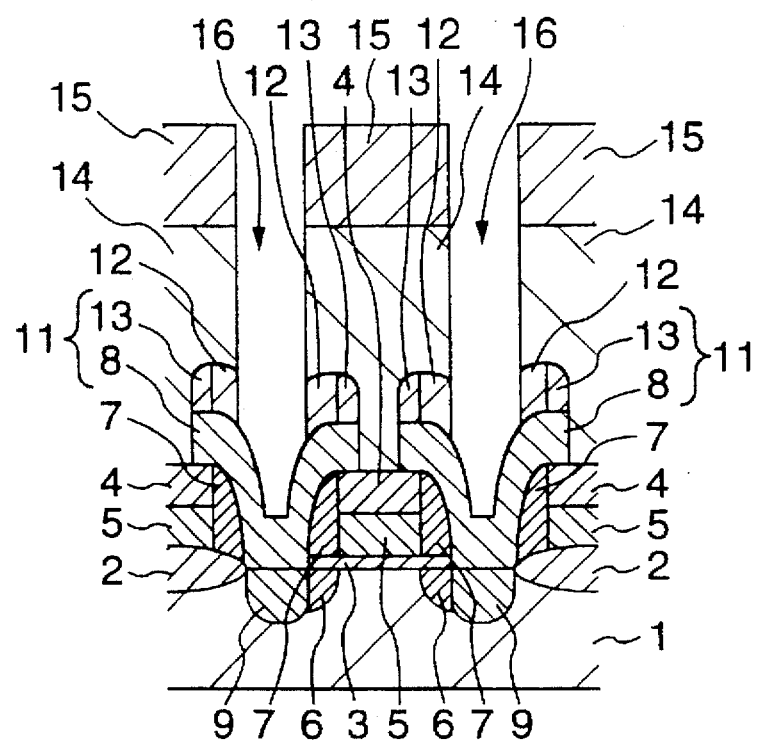

Next, as shown in FIG. 3H, after a BPSG (Boro-Phospho Silicate Glass) film 14, a thickness of which is in the range of 500 to 1,000 nm or so, has been formed on the whole surface of the silicon substrate 1, a photoresist film 15 is applied to the BPSG film 14. Thereafter, the photoresist film 15 is processed by photolithographic technology so as to have a pattern having a hole above the polycrystalline silicon film 8. Then, both the BPSG film 14 and the silicon oxide film 12 are selectively etched away with that photoresist 10 film 15 as an etching mask by anisotropic etching thereby forming a contact hole 16 reaching the polycrystalline silicon film 8.

Figure 3I:
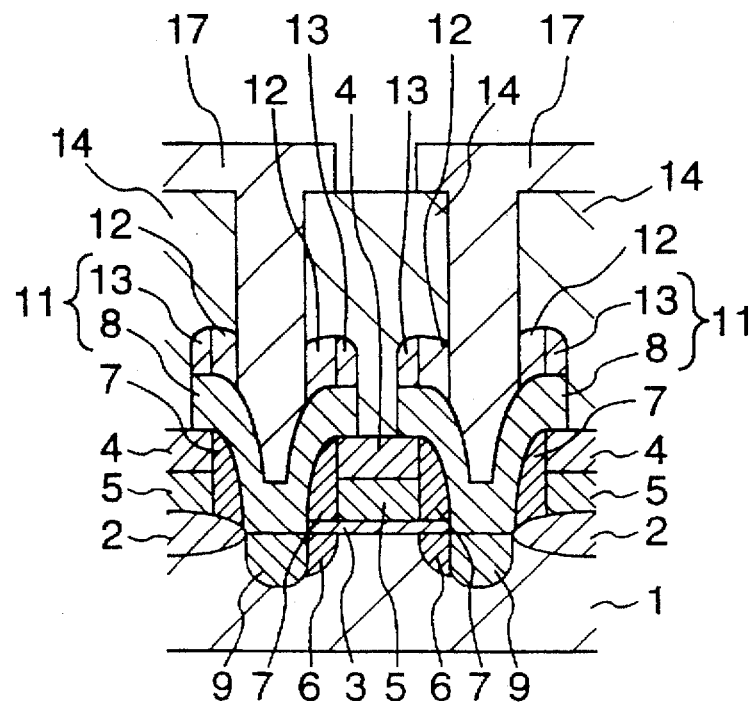

Next, as shown in FIG. 3I, after the photoresist film 15 has been removed, the heat treatment process for activating the impurity diffusion layers 6 and 9 is carried out. Then an aluminum wiring layer 17 is formed which is connected to the polycrystalline silicon film 8 at the bottom of the contact hole 16. Alternatively, a polycrystalline silicon wiring layer 17 is formed which is connected to the polycrystalline silicon film 8 at the bottom of the contact hole 16 and then the heat treatment process for activating the impurity diffusion layers 6 and 9 is carried out. Thereafter, the process for forming a passivation film is carried out, whereby a semiconductor device of the present embodiment is completed.

As described above, according to the present embodiment, the separation width of the polycrystalline silicon film 8 on the silicon oxide film 4 can be made smaller than the width of the slit 10a by the width of the pattern of the polycrystalline silicon film 13 remaining on both sides of the silicon oxide film 12 since the polycrystalline silicon film 8 is selectively etched away with both the silicon oxide film 12 and the polycrystalline silicon film 13 as the etching mask.

Although the first mask layer is formed of the silicon oxide film 12 and also the second mask layer is formed of the polycrystalline silicon film 13 in the present embodiment, the present invention is not limited thereto. Thus, it is to be understood that each of the first and second mask layers may be formed of either an insulating film or a conductive film.

In the case where the first mask layer is formed of a conductive layer, a value of a resistance developed between the source/drain of the MOS transistor and the aluminum wiring layer 17 can be reduced since the area of the conductor contacting with the aluminum wiring 17 is increased. In addition, while the contact hole 16 is perforated to reach the polycrystalline silicon film 8 in the present embodiment, the present invention is not limited thereto. That is, in the case where the first mask layer is formed of conductive film, the contact hole 16 may be perforated to reach at least the first mask layer.

Since the second mask layer is employed as the etching mask for the polycrystalline silicon film 8 containing the impurities, it preferably has a smaller etching rate than that of the polycrystalline silicon film 8. For example, the second mask layer is preferably formed of a polycrystalline silicon film containing no impurity since the etching rate is increased along with an increase in the content of impurities. In this case as well, the second mask layer will have its electric conductivity due to autodoping of the impurities from the polycrystalline silicon film 8 containing the impurities. Alternatively, the second mask layer may be formed of an insulating film which has a smaller etching rate than that of the polycrystalline silicon film 8. The structure in this case will be described in detail later.

In addition, while the LOCOS method is employed as the isolation method in the present embodiment, the present invention is not limited thereto. That is, other well known isolation methods such as the field shielding isolation method may also be employed.

Next, a description will hereinbelow be given with respect to a semiconductor device according to a modification of the first embodiment of the present invention with reference to FIG. 4.

Figure 4:
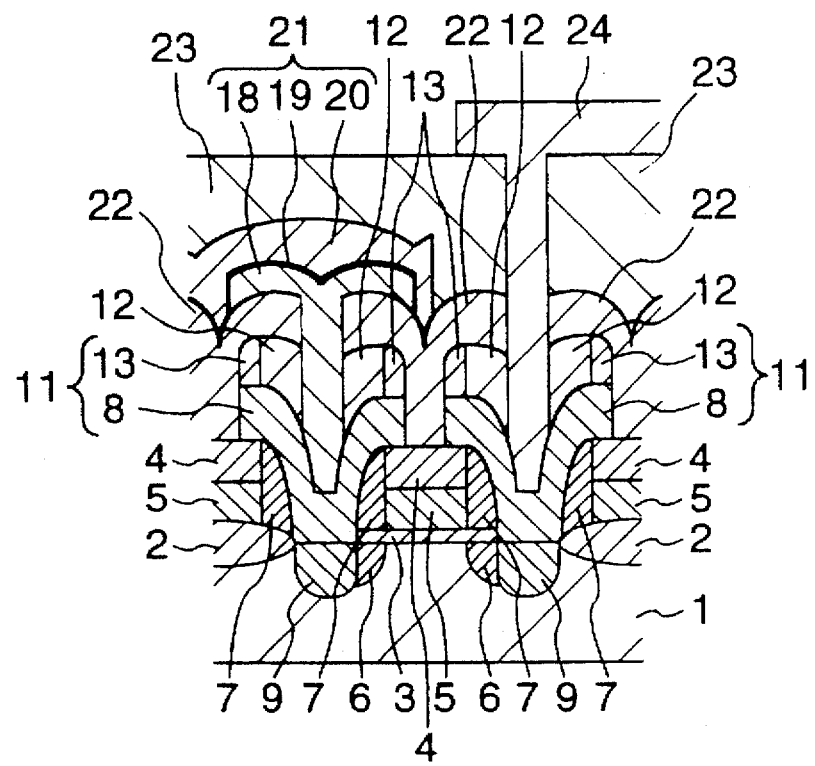
FIG. 4 is a cross sectional view showing a structure of one modification of the semiconductor device according to the first embodiment of the present invention.

FIG. 4, illustrates a cross sectional view showing a structure of an example designed in such a way that one of the source and the drain is connected to a wiring layer 24 through the buried conductive layer 11, and the other is connected to a lower electrode 18 of a capacitor of a DRAM through the buried conductive layer 11.

To manufacture a DRAM memory cell as shown in FIG. 4, after a silicon oxide film 22 has been formed on the whole surface of the silicon substrate 1 from the state shown in FIG. 3G, a contact hole is formed through the silicon oxide film 22 to reach the polycrystalline silicon film 8, and then the lower electrode 18 formed of a polycrystalline silicon film is formed by patterning. Then, after a capacitor dielectric film 19 formed of an ONO film and a upper electrode 20 formed of a polycrystalline silicon film are formed, in this order, to complete a DRAM capacitor 21, a silicon oxide film 23 is formed on the whole surface of the silicon substrate 1; then a contact hole is perforated through the silicon oxide film 23. A wiring layer 24 is then formed which is connected to the polycrystalline silicon film 8 of the films constituting the buried conductive layer 11.

Figure 5:
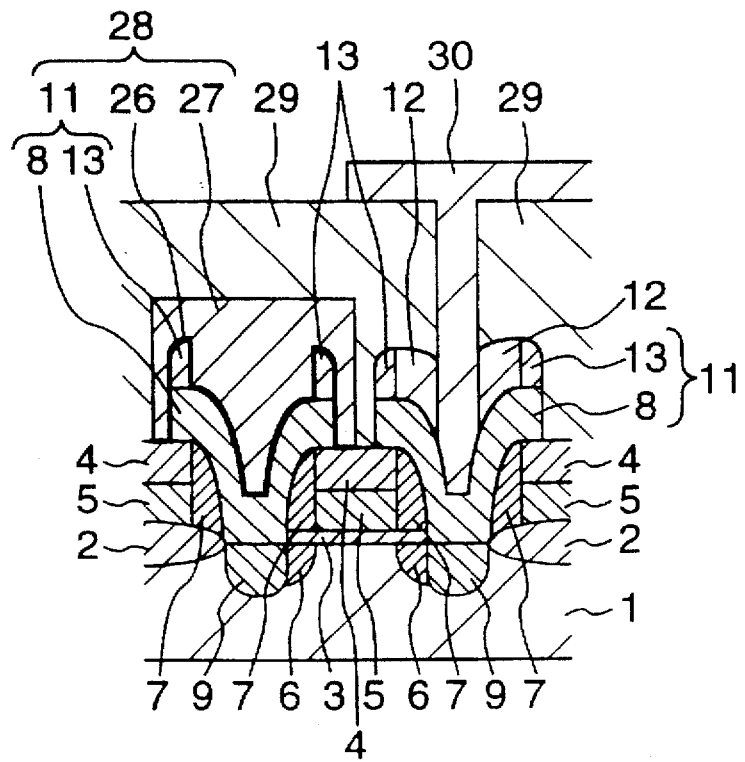
FIG. 5 is a cross sectional view showing a structure of another modification of the semiconductor device according to the first embodiment of the present invention.

Referring to FIG. 5, there is illustrated a cross sectional view showing a structure of another modification of the first embodiment which is designed in such a way that one of the source and the drain is connected to a wiring layer 30 through the buried conductive layer 11, and the other is connected to the buried conductive layer 11 as a lower electrode of a DRAM capacitor.

To manufacture a DRAM memory cell as shown in FIG. 5, after a photoresist film has been formed, which has a hole reaching the silicon oxide film 12 formed on one side, from the state shown in FIG. 3G, the silicon oxide film 12 is selectively removed with the photoresist film as an etching mask by wet etching. Then, the surface of the buried conductive layer 11 is coated with a capacitor dielectric film 26 after removal of the photoresist film, and a upper electrode 27 formed of a polycrystalline silicon film is formed, whereby it is possible to obtain a DRAM capacitor 28 in which the buried conductive layer 11 also serves as a lower electrode. After a silicon oxide film 29 has been formed on the whole surface of the silicon substrate 1, a contact hole is formed through the silicon oxide film 29, and then a wiring layer 30 is formed which is connected to the polycrystalline silicon film 8 on the other side. In this example, the effective surface area of the capacitor is increased; hence, the capacity of the capacitor is increased since the polycrystalline silicon film 13, as a projection portion which projects upwardly in the vicinity of the edge portion of the buried conductive layer 11, can be utilized as a part of the lower electrode.

Next, a description will be given with respect to a semiconductor device according to a second embodiment of the present invention and a method for manufacturing the same with reference to FIGS. 6A to 6E.

Figure 6A:
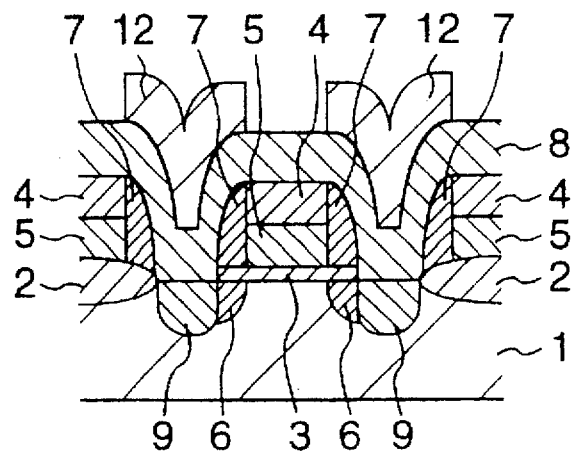
FIGS. 6A to 6E are respectively cross sectional views showing a semiconductor device according to a second embodiment of the present invention, and a method for manufacturing the same in order of process.

In the manufacturing process of the present embodiment, by carrying out the same process as that shown in FIGS. 3A to 3E in the first embodiment of the present invention, there is obtained a structure, as shown in FIG. 6A, having a pattern in which the silicon oxide film (the first mask layer) 12 is separated into portions, located on both sides of the gate electrode 5, with the width of the gate length.

Figure 6B:
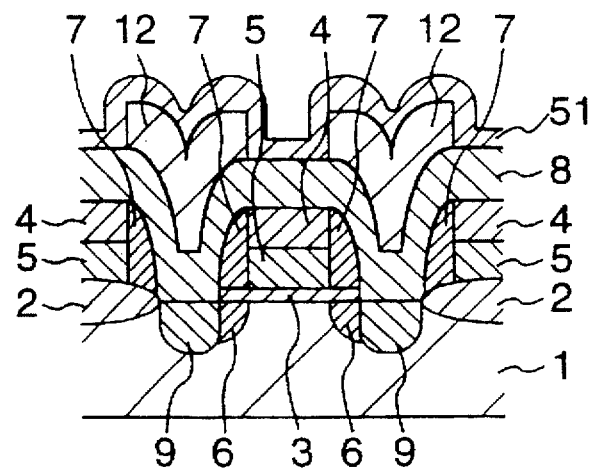

Next, as shown in FIG. 6B, a silicon oxide film (a second mask layer) 51 about 200 nm thick is formed on the whole surface of the silicon substrate 1 by the CVD method.

Figure 6C:
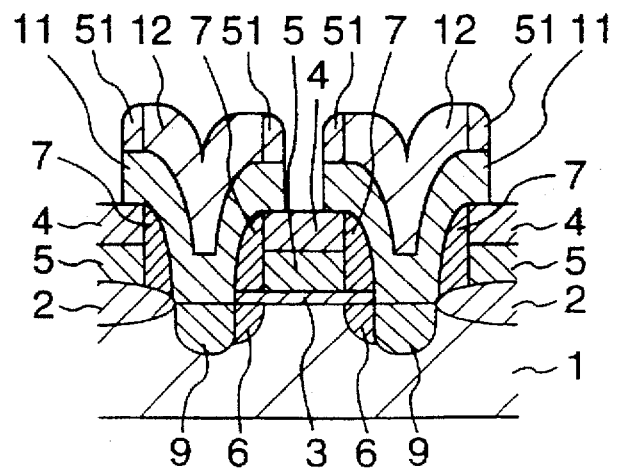

Next, as shown in FIG. 6C, the silicon oxide film 51 is selectively etched away by the anisotropic dry etching so as to be left only on both side faces of the silicon oxide film 12.

Subsequently, the polycrystalline silicon film 8 is selectively etched away with both the silicon oxide films 12 and 51 as an etching mask, whereby the polycrystalline silicon film 8 is selectively removed except its part underlying both the silicon oxide films 12 and 51 so that the polycrystalline silicon film 8 is processed to have a pattern in which it is separated on the silicon oxide film 4. At this time, the separation width of the polycrystalline silicon film 8 is smaller than the width of the slit 10a, which was formed to have the same width as the gate length, by the width of the remaining silicon oxide film 51. As a result, the buried conductive layer 11 formed of the remaining polycrystalline silicon film 8 is formed.

Figure 6D:
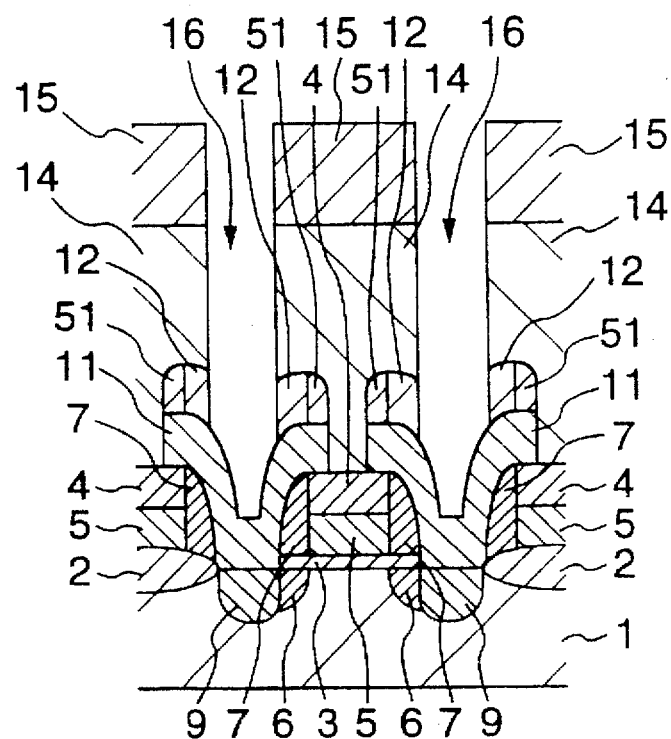

Next, as shown in FIG. 6D, after a BPSG film the thickness of which is in the range of 500 to 1,000 nm, or so, has been formed on the whole surface of the silicon substrate 1, a photoresist film 15 is applied to the BPSG film 14. Thereafter, the photoresist film 15 is processed by photolithographic technology to have a pattern having a hole above the buried conductive layer 11. Then, both the BPSG film 14 and the silicon oxide film 12 are selectively etched away with the photoresist film 15 thus processed as an etching mask by anisotropic etching, thereby forming a contact hole 16 to reach the buried conductive layer 11.

Figure 6E:
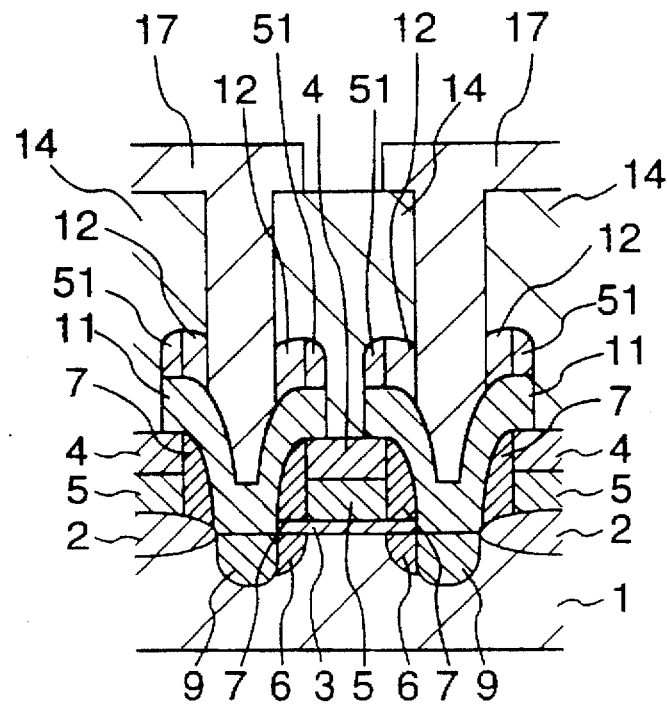

Next, as shown in FIG. 6E, after the photoresist film 15 has been removed, the heat treatment for activating both the impurity diffusion layers 6 and 9 is carried out and then an aluminum wiring layer 17 is formed which is connected to the buried conductive layer 11 at the bottom of the contact hole 16. Alternatively, a polycrystalline silicon wiring layer 17 is formed which is connected to the buried conductive layer 11 at the bottom of the contact hole 16 and then, the heat treatment for activating both the impurity diffusion layers 6 and 9 is carried out. Thereafter, the process for forming a passivation film is carried out, whereby the semiconductor device of the present embodiment is completed.

In the present embodiment as well, similarly to the above-mentioned first embodiment, it is effectively avoided that the surface of the semiconductor substrate is partially etched away while etching the polycrystalline silicon film 8, and the semiconductor substrate is damaged, e.g., a trench is formed in the semiconductor substrate. As a result, the reliability of the MOS transistor can be remarkably improved. In addition, since the separation width of the polycrystalline silicon film 8 can be made smaller than the minimum processing size provided by the photolithographic technology, the gate length of the gate electrode 5 can have a minimum processing size and hence a finer MOS transistor can be manufactured.

In addition, since in the present embodiment, the first and second mask layers are respectively formed of silicon oxide films 12 and 51, each having an etching rate smaller than that of the polycrystalline silicon film 8, the separation width of the polycrystalline silicon film 8 can be made smaller as compared with the case where the second mask layer is formed of a film having a large etching rate.

Incidentally, the present embodiment may also be applied to the method for manufacturing a DRAM in the above-mentioned modifications as shown in FIG. 4 and FIG. 5.

Further, while the LOCOS method is employed as the isolation method in the present embodiment, the present invention is not limited thereto. That is, there may be employed other well known isolation methods such as the field shielding isolation method.

As set forth hereinabove, according to the present invention, it is possible to reduce the likelihood that the edge portion of the pattern of the second conductive film is located on the associated side wall insulating film since the separation width of the second conductive film constituting the buried conductive layer can be made smaller than the interval of the patterns of the first mask layers by the width of the pattern of the second mask layer. As a result, it is possible to solve the problem that while etching the second conductive film, even the semiconductor substrate is partially etched away and damaged. As a result, it is possible to remarkably improve the reliability of the MOS transistor without harming the advantage, resulting from the buried conductive layer, that the buried conductive layer can be formed to be self-aligned with the source/drain.

In addition, according to the present invention, the width (the gate length) of the first conductive film (the gate electrode) can be reduced to the minimum processing size since the separation width of the second conductive film can be smaller than the minimum processing size. Therefore, it is possible to manufacture a MOS transistor finer than that by the prior art.

While the present invention has been particularly shown and described with reference to the preferred embodiments of the specified modifications thereof, it will be understood that the various changes and other modifications will occur to those skilled in the art without departing from the scope and true spirit of the invention. The scope of the invention is therefore to be determined by the appended claims.

I claim:

1. A semiconductor device comprising:

a semiconductor substrate having a source and a drain of a MOS transistor formed therein;

a first insulating film formed on a predetermined region of said semiconductor substrate;

a first conductive film as a gate electrode and a second insulating film formed on a predetermined region of said first insulating film;

a third insulating film, as a side wall insulating film, formed on each of both side faces of said first conductive film and said second insulating film;

a second conductive film connected to one of said source and said drain of said MOS transistor and extending over said gate electrode of said MOS transistor, said second conductive film having a pattern in which said second conductive film is separated into both side portions as to said second insulating film;

a first mask layer formed on a first region of said second conductive film; and a second mask layer formed on a second region of said second conductive film along each of side faces of said first mask layer.

2. A semiconductor device according to claim 1, wherein said first mask layer is formed of an insulating film, and said second mask layer is formed of a conductive film.

3. A semiconductor device according to claim 1, wherein each of said first and second mask layers is formed of an insulating film.

4. A semiconductor device according to claim 1, wherein said first mask layer is formed of a conductive film, and said second mask layer is formed of an insulating film.

5. A semiconductor device according to claim 1, wherein each of said first and second mask layers is formed of a conductive film.

6. A semiconductor device according to claim 1, further comprising:

an interlayer insulating film formed on said second insulating film, and said first and second mask layers, a contact hole being formed through both said interlayer insulating film and said first mask layer so as to reach said second conductive film; and a wiring layer formed on said interlayer insulating film so as to fill in said contact hole, said wiring layer being connected to said second conductive film at the bottom of said contact hole.

7. A semiconductor device according to claim 1, further comprising:

a fourth insulating film formed on said second insulating film, and said first and second mask layers, a contact hole being formed through both said fourth insulating film and said first mask layer so as to reach said second conductive film;

a first electrode formed on said fourth insulating film so as to fill in said contact hole, said first electrode being connected to said second conductive film at the bottom of said contact hole;

a dielectric film with which a surface of said first electrode is coated; and a second electrode formed on said dielectric film.

8. A semiconductor device comprising:

a semiconductor substrate having a source and a drain of a MOS transistor formed therein;

a first insulating film formed on a predetermined region of said semiconductor substrate;

a first conductive film as a gate electrode and a second insulating film formed on a predetermined region of said first insulating film;

a side wall insulating film formed on each of both side faces of said first conductive film and said second insulating film;

a second conductive film connected to one of said source and said drain of said MOS transistor and extending over said gate electrode of said MOS transistor, said second conductive film having a pattern in which said second conductive film is separated into both side portions as to said second insulating film; and a mask layer formed on an edge region of said second conductive film.

9. A semiconductor device according to claim 8, wherein said mask layer is formed of a conductive film.

10. A semiconductor device according to claim 8, wherein said mask layer is formed of an insulating film.

11. A semiconductor device according to claim 8, further comprising:

a dielectric film with which at least a surface of said second conductive film is coated; and an electrode formed on said dielectric film.

* * * * *